United States Patent
McClure

(10) Patent No.: US 6,781,916 B2
(45) Date of Patent: Aug. 24, 2004

(54) INTEGRATED VOLATILE AND NON-VOLATILE MEMORY

(75) Inventor: David C. McClure, Carrollton, TX (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 10/442,844

(22) Filed: May 20, 2003

(65) Prior Publication Data

US 2003/0210599 A1 Nov. 13, 2003

Related U.S. Application Data

(62) Division of application No. 09/653,495, filed on Aug. 31, 2000, now Pat. No. 6,594,192, and a division of application No. 09/751,986, filed on Dec. 29, 2000, now Pat. No. 6,584,007.

(51) Int. Cl.[7] .................................................. G11C 7/00
(52) U.S. Cl. .................. 365/230.03; 365/63; 365/225.7
(58) Field of Search ............................ 365/230.03, 63, 365/94, 96, 201, 225.7

(56) References Cited

U.S. PATENT DOCUMENTS

| | | | | |
|---|---|---|---|---|
| 4,253,059 A | * | 2/1981 | Bell et al. .................... 714/721 |
| 5,239,656 A | * | 8/1993 | Kawano ....................... 714/746 |
| 5,523,915 A | * | 6/1996 | Kamuda ................. 365/189.01 |
| 5,867,443 A | * | 2/1999 | Linderman .................. 365/228 |

* cited by examiner

Primary Examiner—Vu A. Le
(74) Attorney, Agent, or Firm—Lisa K. Jorgenson; Andre Szuwalski

(57) ABSTRACT

A memory device having a first and a second memory section, the first and the second memory sections being coupled to bit lines. The second memory section may include at least one fuse. The first memory section includes a volatile memory and the second memory section includes a non-volatile memory. The volatile memory may be static or dynamic random access memory. The memory device may further include a control circuit connected to the at least one fuse to provide for prelaser testing.

31 Claims, 4 Drawing Sheets

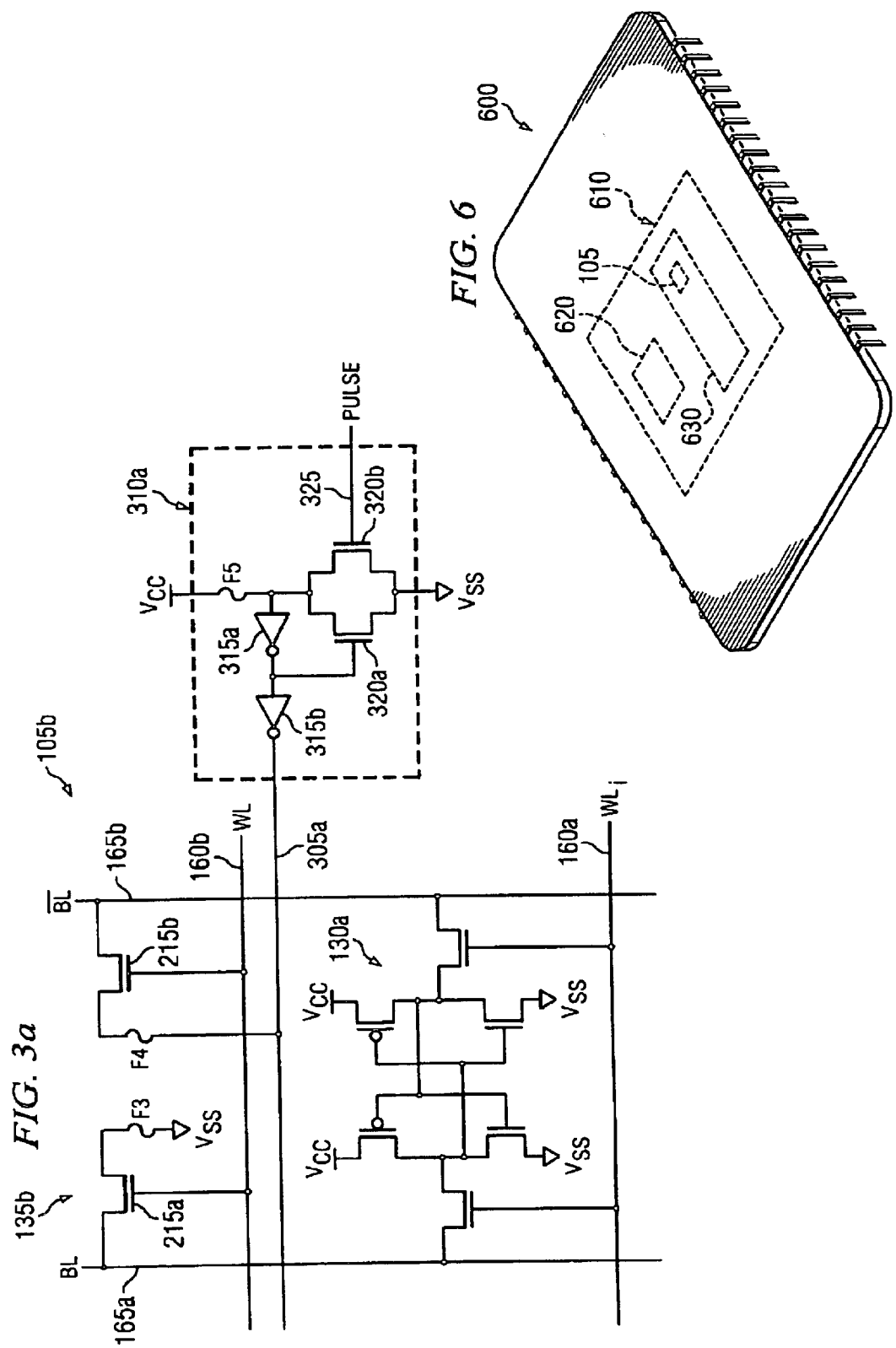

INTEGRATED VOLATILE AND NON-VOLATILE MEMORY

This application is a divisional of application No. 09/653,495 filed Aug. 31, 2000, now U.S. Pat. No. 6,594,192 and application of pending U.S. patent application Ser. No. 09/751,986 filed Dec. 29, 2000, now U.S. Pat. No. 6,584,007.

BACKGROUND OF THE PRESENT INVENTION

1. Field of the Invention

The present invention relates to memory devices, and more specifically, to memory devices having both volatile and non-volatile memory devices.

2. Background of the Invention

Manufacturers of memory components are often requested by their customers to provide non-volatile information within volatile memory components. The non-volatile information may include serial numbers, device type, lot number, date processed, customer specific information, etc. In some cases, there are a large number of non-volatile memory elements dedicated to storing the non-volatile information.

Non-volatile memory elements presently are not integrated with volatile memory elements or components. The term "non-volatile memory element" shall be defined herein for the purposes of this invention to mean a one-time programmable memory element. The term "volatile memory element" shall be defined herein for the purposes of this invention to mean a multi-time programmable memory element. The term "integrated" shall be defined herein for the purposes of this invention to mean that the non-volatile memory elements are coupled to the same bit lines that the volatile memory elements are coupled (e.g., a cell of a volatile memory section shares a bit line or bit line pair with a cell of a non-volatile memory section). Because the non-volatile and volatile memory components of conventional memory systems are not integrated, access to each section of memory (i.e., non-volatile and volatile memory) is performed on separate electrical paths that are multiplexed. Because access to each memory section of memory is created by a multiplexing operation, the non-volatile and volatile memory is not considered to be integrated. Multiplexing allows for reading the stored information in either the non-volatile or the volatile memory elements from the same input/output port, but not the same reading device. In general, drivers are utilized to read from the non-volatile memory and a sense amplifier is utilized to read from the volatile memory. Additionally, these non-volatile memory elements can be relatively big and bulky and not interface easily with the volatile memory elements due to the different reading devices.

SUMMARY OF THE INVENTION

To overcome the problems of contemporary memory having non-integrated, non-volatile and volatile memory elements, the two types of memory components are integrated. The term "integrated" shall be defined herein for the purposes of this invention to mean that the non-volatile memory elements are coupled to the same bit lines that the volatile memory elements are coupled. The integration of the two types of memory creates a small, compact solution with a minimum number of elements. The integration of the two memory types further allows for a simple interface that utilizes a single reading device (e.g., a sense amplifier).

One embodiment according to the principles of the present invention is a memory device having a first and a second memory section. The first and the second memory sections are coupled via bit lines. The first memory section may be static or dynamic random access memory. The second memory section includes current path elements capable of being substantially permanently opened. The second memory section may further include at least one fuse.

A second embodiment according to the principles of the present invention is an integrated circuit having at least one bit line pair shared by volatile and non-volatile memory elements and at least one word line coupled to each memory element. The memory elements are organized in a matrix configuration, the bit lines forming columns of memory cells and the word lines forming rows of memory cells. A first type and a second type of memory element share at least one bit line pair. The first type of memory element may be a static or dynamic random access memory and the second type of memory element is read only memory. The second type of memory may include at least one fuse.

Another embodiment according to the principles of the present invention includes a system having a processor and a memory. The memory includes a first memory type and a second memory type. The memory further includes a sense amplifier shared by both the first and second memory type. The first memory type is volatile memory and the second memory type is non-volatile memory. The second memory type may include at least one fuse.

The present invention further includes a method of pre-laser testing a non-volatile memory element integrated within a volatile memory. At least one logic voltage level is applied to the non-volatile memory element. The non-volatile memory element is selectively accessed and a logic level stored within the non-volatile memory elements is read. Prior to reading, bit lines are precharged.

BRIEF DESCRIPTION OF THE DRAWINGS

A more complete understanding of the method and apparatus of the present invention may be obtained by reference to the following Detailed Description when taken in conjunction with the accompanying Drawings wherein:

FIG. 3a is a schematic diagram of a single static random access memory cell and a second embodiment of a non-volatile memory cell according to the configuration of FIG. 1;

FIG. 6 is a schematic of a chip package that houses an integrated circuit having the integrated volatile and non-volatile memory of FIGS. 1–3b.

DETAILED DESCRIPTION OF THE DRAWINGS

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Non-volatile memory elements are integrated within volatile memory to reduce space and eliminate circuitry for accessing previously non-integrated, non-volatile memory elements. The term "integrated" shall be defined herein for the purposes of this invention to mean that the non-volatile memory elements are coupled to the same bit lines that the volatile memory elements are coupled. The non-volatile memory elements, which generally comprise fuses, are utilized for storing manufacturing and customer information, such as lot number, date processed, serial number, etc. By integrating the non-volatile memory elements within the volatile memory, both the volatile and non-volatile memory may be read via substantially the same circuitry (e.g., sense amplifier, row and column decoders) and the timing for reading either the volatile or non-volatile memory is substantially similar. Additionally, because the non-volatile memory elements are integrated within the volatile memory, pre-laser testing can be performed on the non-volatile memory elements.

Figure 1:
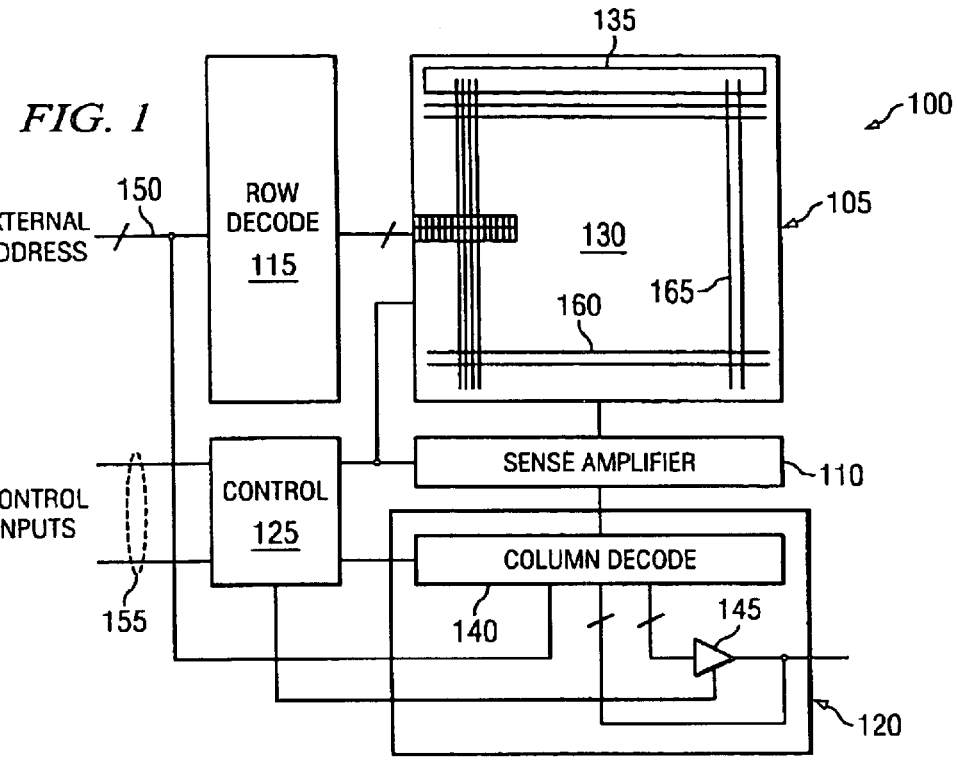
FIG. 1 is a schematic diagram of a random access memory device having integrated volatile and non-volatile memory sections.

FIG. 1 is a schematic diagram of a random access memory (RAM) device 100. The RAM device may be a static random access memory (SRAM) device or a dynamic random access memory (DRAM) device. The RAM device 100 includes a memory 105, a sense amplifier 110, a row decoder 115, an output section 120, and a controller 125. The memory 105 comprises a volatile memory section 130 and a non-volatile 135 memory section. The volatile 130 and non-volatile 135 memory sections may be considered to reside in distinct regions, however, the volatile 130 and non-volatile 135 memory sections are integrated. The non-volatile memory section 135 is coupled to distinct word lines 160 from the volatile memory section 130. Note that both sets of word lines 160 are coupled to the same row decoder 115. Both the volatile 130 and non-volatile 135 memory sections are coupled to or share the same bit line pairs 165. The word lines 160 and the bit line pairs 165 form a grid or matrix of memory cells. The output section 120 includes a column decoder 140 and an output buffer/driver 145.

In operation, to access (e.g., read, write, refresh) a particular memory cell, an external address is transmitted on an address bus 150 to the row 115 and column 140 decoders. The particular access mode is enabled by control inputs on a control bus 155 and asserted by the controller 125 to the memory 105 and the sense amplifier 110. Because the volatile 130 and the non-volatile 135 memory sections are integrated, access to a particular memory cell within either the volatile 130 or non-volatile 135 memory section is performed by providing an external address to the controller 125 and accessing the particular memory cell using the sense amplifier 110. It should be understood that access to the volatile 130 and non-volatile 135 memory sections is performed utilizing the same bit lines and in the traditional manner that the volatile memory section 130 is accessed.

Figure 2:
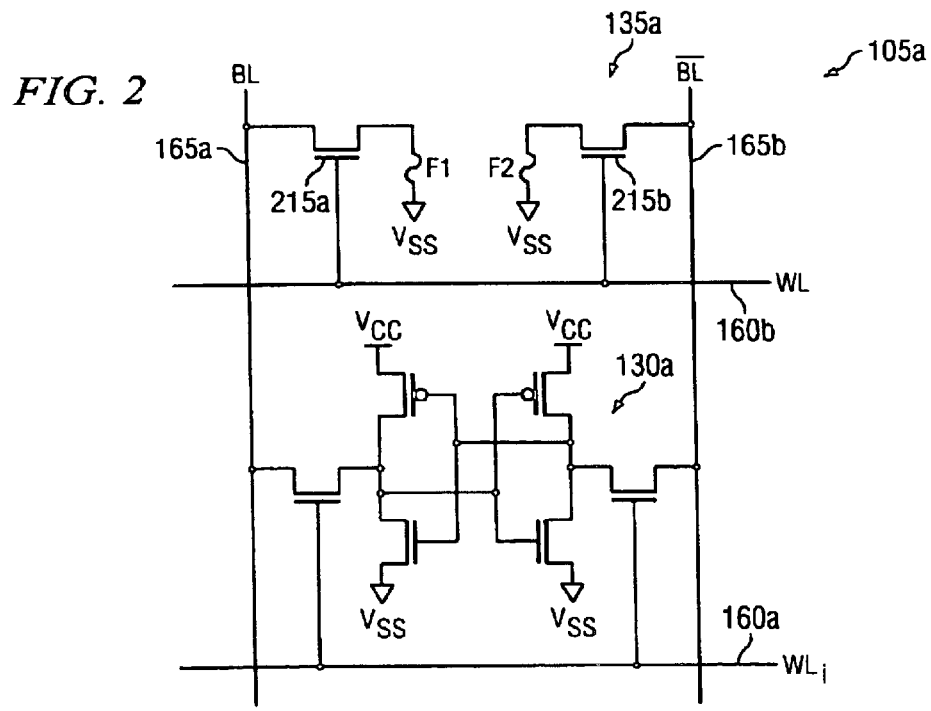
FIG. 2 is a schematic diagram of a single static random access memory cell and one embodiment of a non-volatile memory cell according to the configuration of FIG. 1.

FIG. 2 is an exemplary circuit 105a comprising one volatile 130a and one non-volatile 135a memory cell. The volatile memory cell 130a is a static random access memory (SRAM) cell 130a having a six transistor (6T) configuration as is known in the art. Alternatively, a dynamic random access memory cell or some other volatile memory cell could be the volatile memory cell. The static random access memory cell 130a is coupled to a bit line pair 165a and 165b (hereinafter 165) for reading and writing data to and from the SRAM cell 130a. A word line WL 160a is coupled to the SRAM cell 130a for providing access to the SRAM cell 130a during read and write operations.

The non-volatile memory cell 135a, which may be read only memory (ROM), comprises a pair of transistors 215a, 215b and a pair of fuses F1 and F2. The pair of transistors 215a, 215b are each coupled to a word line (WL) 160b via a gate terminal for providing access to the stored logic level (i.e., datum) within the non-volatile memory cell 135a. Each transistor 215a, 215b is an N-type transistor having a drain terminal connected to a bit line 165a, 165b, respectively, and a source terminal connected to a fuse F1 and F2, respectively. Alternatively, an electrical component capable of being temporarily or substantially permanently opened could be utilized instead of the fuses F1 and F2. Notably, the non-volatile memory cell 135a and the volatile memory cell 130a share the same pair of bit lines 165.

The non-volatile memory cell 135a is programmed by blowing either fuse F1 or F2 using a laser as is well understood in the art. To program the non-volatile memory cell 135a, for example, fuse F1 is blown, so that bit line BL 165a has no discharge path upon word line 160b being set to a high logic voltage level. As fuse F2 is not blown, a discharge path through transistor 215b for bit line 165b exists, thereby allowing the bit line 165b to discharge by 100 milli-volts (mV) upon transistor 215b being enabled by the word line 160b, for example. Therefore, a high logic voltage level is stored in the non-volatile memory cell associated with the transistor 215a and a low logic voltage level is stored in the non-volatile memory cell associated with the transistor 215b.

To read the non-volatile memory cell 135a, a similar process to reading the volatile memory cell 130a is performed. The reading process includes: precharging the bit line pair 165 to the same voltage level (e.g., VCC), applying a high logic voltage level to the word line 160b, and sensing by the sense amplifier that one of the bit lines 165a, 165b of the bit line pair 165 discharges. Because the non-volatile memory cell 135a is integrated within the volatile memory (i.e., along the same shared bit lines), the timing and the circuitry for reading the non-volatile memory cell 135a are substantially the same as for reading the volatile memory cell 130a. In other words, the same sense amplifier 110 and row 115 and column 140 decoders are utilized for reading the non-volatile 135 and volatile 130 memory cells. During the read process, in general, the sense amplifier 110 senses a discharge of 100 mV, for example, on a bit line to measure a differential across the bit line pair 165, which is true for reading either the volatile 130a or non-volatile 135a memory cell.

Non-volatile memory cells may replace existing volatile memory cells to maintain an existing volatile memory device design (i.e., having the same number of memory elements). In other words, a 64K memory device may remain a 64K memory device having integrated non-volatile and volatile memory cells. For example, one kilobyte (1K) of non-volatile memory cells can replace 1K of volatile memory cells so that the memory device includes 63K of volatile memory cells and 1K of non-volatile memory cells. Alternatively the non-volatile memory cells may be added to an existing volatile memory device design, but additional circuitry, such as additional word lines and sense amplifier components, may be necessary.

While the fuses F1 and F2 are shown connecting Vss to respective transistors 215a and 215b, a different voltage level could be connected, such as Vcc. However, to read from the non-volatile memory cell, the bit lines 165a, 165b would be precharged to a voltage level other than Vcc so that a voltage differential across the bit line pair 165 could be sensed by the sense amplifier.

Figure 3B:
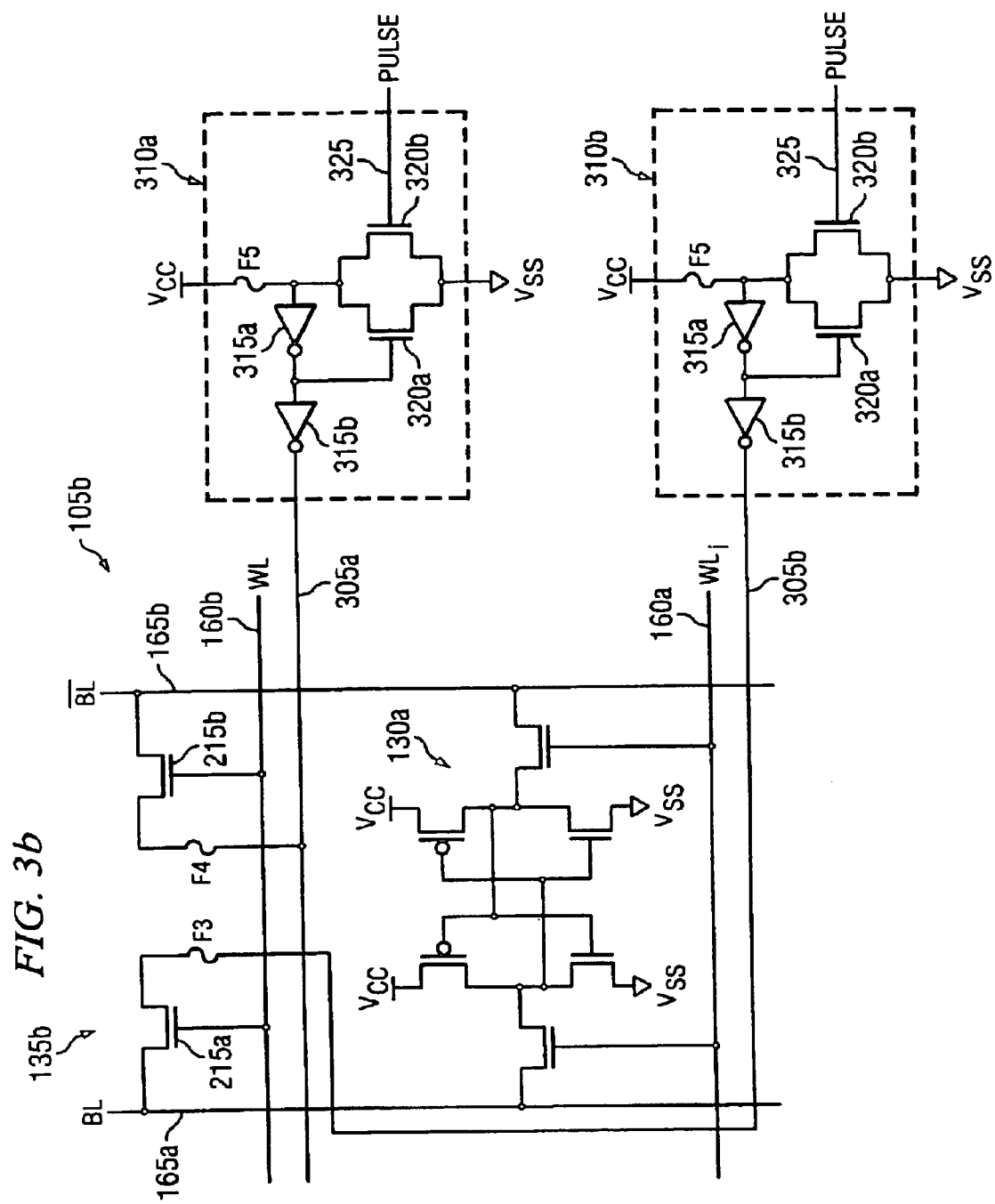
FIG. 3b is another schematic diagram according to the configuration of FIG. 3a having multiple control circuits.

FIG. 3a is another embodiment of a circuit 105b comprising the volatile 130a and a non-volatile memory cell 135b according to the principles of the present invention. The non-volatile memory cell 135b comprises two fuses F3 and F4. Fuse F4 is connected to an output line 305a of a control circuit 310a and fuse F3 is connected to Vss. In another embodiment, fuse F3 could be connected to the output of the control circuit 310a and the fuse F4 could be connected to Vss. In yet another embodiment, two control circuits could be included, where a first control circuit 310a is connected to fuse F3 and a second control circuit (not shown) is connected to fuse F4 (see, FIG. 3b). It should be understood that the control circuit 310a is used for pre-laser testing and not as part of the read operation (i.e., the read operation for FIGS. 2 and 3 operate identical and that the control circuit 310a is not utilized during normal operations).

The control circuit 310a includes a fuse F5, a pair of series-connected inverter gates 315a and 315b, and a parallel-connected N-type CMOS transistors 320a and 320b. The fuse F5 is connected to Vcc and the input of the inverter gate 315a. The output of the inverter gate 315b is connected to the output line 305a of the control circuit 310a. Alternatively, the fuse F5 can be connected to circuitry that provides a logic high voltage level during test mode and a logic low voltage level during normal operating mode. In another embodiment, a test pad can be utilized to control the output line 305a during test mode, where the control circuit 310a may or may not includes a fuse and/or other logic components. It should be understood that the other circuit configurations are possible, and the principles of the present invention are meant to cover the functionality to provide for prelaser testing.

In operation, the control circuit 310a allows for prelaser testing of the non-volatile memory cell 135b. To test the non-volatile memory cell 135b, the word line 160b is selected (i.e., set to a logic high voltage level) to turn on the N-type transistors 215a and 215b. Because both fuses F3 and F4 are still intact during prelaser testing, when fuse F3 is connected to Vss (i.e., logic low voltage level) and fuse F4 is connected to a logic high voltage level from the control circuit 310a, a differential voltage between the bit lines 165a, 165b of the bit line pair 165 is created when the bit lines 165a and 165b are precharged at a logic high voltage level (i.e., bit line 165a is discharged and bit line 165b remains at a logic high voltage level). Because fuse F5 is connected to Vcc having a logic high voltage level, the output line 305a of the control circuit 310a is a logic high voltage level. It should be understood that in the other embodiments described above (e.g., fuse F3 connected to the control circuitry 310a and two different control circuits connected to the fuses F3 and F4), a differential voltage is also created on each bit line 165a, 165b of the bit line pair 165 to test the non-volatile memory cell 135b.

After testing the non-volatile memory cell 135b, the fuse F5 is blown using a laser. Although the laser blows the fuse F5, the fuse F5 sometimes has slight residue remaining to provide a weak conductor. The parallel-connected N-type transistors 320a, 320b provide for pulling the input terminal of the inverter gate 315a to a logic low voltage level. Because the blown fuse F5 may remain a weak connection to Vcc, a logic low voltage level (i.e., Vss) being applied to the input terminal of the inverter gate 315a as a result of a logic high pulse signal on a pulse line 325 ensures that the output line 305a of the control circuit 310a remains low during normal operating mode. In other words, the configuration of the non-volatile memory cell 135b is guaranteed to be identical to the non-volatile memory cell 135a (see FIG. 2) upon the fuse F5 being blown, which causes output line 305a to be at a logic low voltage level.

FIG. 3b is another embodiment according to FIG. 3a. A second control circuit 310b controls a voltage level being applied to fuse F3 via output line 305b. Fuses F3 and F4 are independently controllable using control circuits 310b and 310a, respectively, so that the non-volatile memory cell 135b can have each of the transistors 215a and 215b tested prior to setting the non-volatile memory cell 135b by blowing either fuse F3 and F4. By utilizing two control circuits 310a and 310b, a logic high voltage level can be applied to fuse F3 and a logic low voltage level can be applied to fuse F4 or vice versa so that both transistors 215a and 215b can be fully tested.

Figure 4:
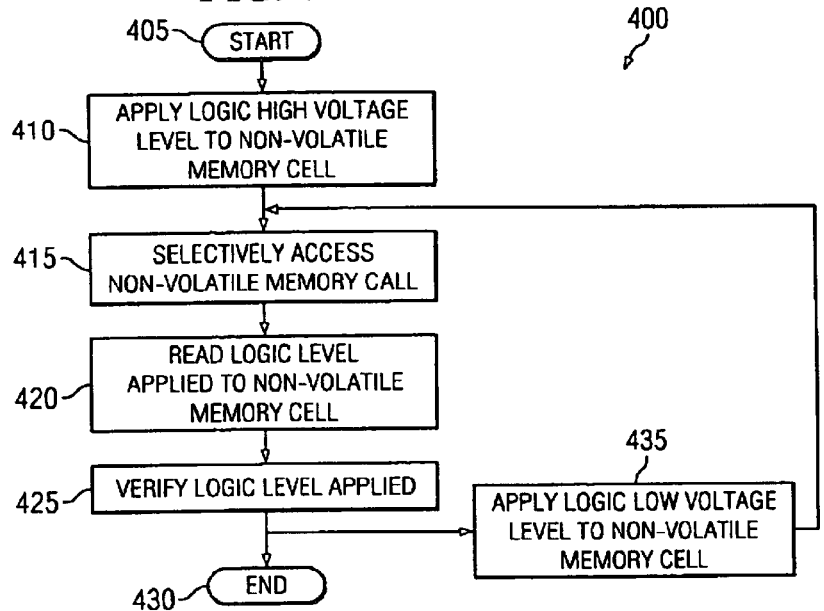
FIG. 4 is a representative flow diagram of a pre-laser testing operation of a non-volatile memory element integrated within a volatile memory according to FIGS. 1–3b.

FIG. 4 is a representative flow diagram 400 of a pre-laser test operation to determine the fidelity of the non-volatile memory cell 135b (see FIG. 3a). The pre-laser testing operation starts at step 405. At step 410, the non-volatile memory element 135b integrated within the volatile memory 130a being tested is applied a logic high voltage level to the fuse F4 from the control circuit 310a. The logic high voltage level simulates a logic low voltage level being stored in the non-volatile memory cell 135b as measured along the bit line 165a.

At step 415, the non-volatile memory cell 135b is selectively accessed (i.e., the bit line pair 165 and the word line 160b are selected). At step 420, the logic level applied to the non-volatile memory element 135b is read by the sense amplifier. At step 425, the logic level applied to the non-volatile memory element 135b is verified to determine if the non-volatile memory element 135b was properly manufactured. The pre-laser test is completed at step 430. It should be understood that the pre-laser test would be performed differently upon a different configuration of the non-volatile memory cell 135b and control circuit 310a as previously discussed with regard to FIGS. 3a and 3b. For example, at step 435, a logic low voltage level may be applied to the non-volatile memory cell 135b using the control circuits 310a and 310b according to FIG. 3b. Thus, the non-volatile cells can be fully exercised with a stored logic low voltage level and a logic high voltage level prior to blowing any fuses. This can provide detection of defects within non-volatile memory cells and allow for replacement of the inoperative non-volatile memory cells by using redundancy techniques or simply scrapping the dye.

Figure 5A:
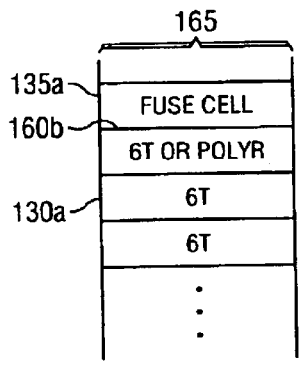
FIGS. 5a–5c are exemplary memory layouts for integrated volatile and non-volatile memory cells according to FIGS. 1–3b.
Figure 5B:
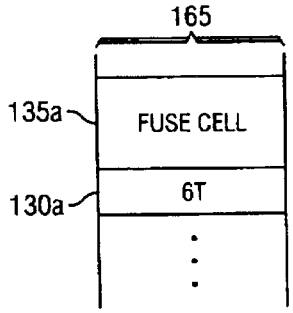
Figure 5C:
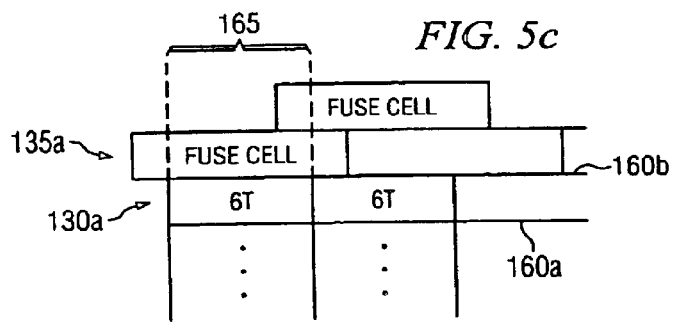

FIGS. 5a–5c are exemplary memory layouts including integrated volatile and non-volatile memory cells according to FIG. 2. As previously discussed, to reduce conventional memory re-design efforts, it is preferable to integrate the two memory types.

FIG. 5a is a first embodiment of a non-volatile memory cell or fuse cell integrated within a volatile memory. The non-volatile memory cell 135a in this embodiment is sized to fit within the bit line pair 165 and above the word line 160b and is capable of residing directly above the 6T cell or volatile memory cell 130a. It should be understood that the volatile memory cell 130a could be a poly resistive (polyR) cell as is commonly known in the art. FIG. 5b shows a fuse cell or non-volatile memory cell 135a that is taller than a normal volatile memory cell 130a due to the use of larger components, such as fuses. By configuring the non-volatile memory cell 135a to be taller, the non-volatile memory cell 135a is capable of fitting within the bit line pair 165. FIG. 5c shows a non-volatile memory cell 135a that is wider than the bit line pair 165. Because the non-volatile memory cell 135a is wider than the bit line pair 165, the non-volatile memory cell 135a is staggered above the columns of volatile memory cells 130a so that access to the bit line pair 165 and word line 160b is possible and that redesign of volatile memory devices to include the non-volatile memory elements is reduced. Also, the non-volatile memory cells 135a may share the same word line as the volatile memory cells 130a.

FIG. 6 is a schematic of a chip package 600 housing an integrated circuit 610. The integrated circuit 610 may be an application specific integrated circuit (ASIC), having circuitry 620 that may or may not be customized and a memory 630 that includes the integrated volatile and non-volatile memory 105 according to the principles of the present invention. The circuitry 620 may be discrete logic, a general processor, a signal processor, a programmable gate array (PGA), a programmable logic array (PLA), or any other circuitry that utilizes the integrated memory 105.

Figure 7:
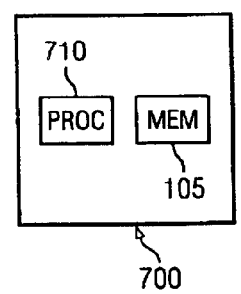
FIG. 7 is an exemplary system that utilizes the integrated volatile and non-volatile memory of FIGS. 1–3b according to the principles of the present invention.

FIG. 7 is an exemplary system 700 (e.g., processing device, such as a personal computer) that utilizes a processor 710 the integrated volatile and non-volatile memory 105 according to the principles of the present invention. It should be understood that the exemplary system 700 could be other types of communication systems (e.g., two-way radio), computing systems (e.g., desktop computers, laptop computers, handheld computers), or display devices (e.g., computer monitor, television), or any other electronic device with or without a processor (e.g., smart card) that utilizes the integrated memory 105.

The previous description is of a preferred embodiment for implementing the invention, and the scope of the invention should not necessarily be limited by this description. The scope of the present invention is instead defined by the following claims.

What is claimed is:

1. An integrated circuit having at least one bit line pair coupled to a plurality of memory elements and at least one word line coupled to each memory element, the memory elements being organized along the bit lines, the at least one bit line pair forming columns of memory elements and the at least one word line forming rows of memory elements, the integrated circuit comprising:
    a first type of memory element coupled between the at least one bit line pair; and
    a second type of memory element coupled between the at least one bit line pair, the at least one bit line pair shared by the first type and second type of memory element.

2. The integrated circuit according to claim 1, further comprising a sense amplifier coupled to the first and second type of memory elements via the at least one bit line pair.

3. The integrated circuit according to claim 1, wherein the memory element includes at least one fuse.

4. The integrated circuit according to claim 3, wherein the second type of memory element includes a transistor coupled between the at least one fuse and one bit line of the at least one bit line pair, a gate terminal of the transistor is coupled to a word line.

5. The integrated circuit according to claim 4, further comprising a common node, the fuse being coupled between the common node and the transistor.

6. The integrated circuit according to claim 5, wherein the common node is a node having a Vss voltage level applied thereto.

7. The integrated circuit according to claim 5, wherein the common node is coupled to a control circuit.

8. The integrated circuit according to claim 1, wherein the second type of memory element includes a first transistor coupled to a first bit line and a second transistor coupled to a second bit line, both the first and the second bit lines being of the same at least one bit line pair.

9. The integrated circuit according to claim 8, further comprising a first fuse coupled to the first transistor and a second fuse coupled to the second transistor, each of the fuses being coupled to a distinct common node.

10. The integrated circuit according to claim 9, wherein each distinct common node is selectably applied a different voltage level.

11. The integrated circuit according to claim 1, wherein the first type of memory element includes at least one of the following memory elements:
    a static random access memory element; and
    a dynamic random access memory element.

12. The integrated circuit according to claim 1, further comprising control circuitry for selectively applying a logic voltage level to at least one memory element of the second type of memory element for testing the at least one memory element.

13. The integrated circuit according to claim 12, wherein the logic level is selectively applied to a common node.

14. The integrated circuit according to claim 1, further comprising a test pad for selectively applying a logic voltage level to at least one memory element of the second type of memory cell.

15. The integrated circuit according to claim 1, further comprising a fuse based circuit for selectively applying a logic voltage level to at least one memory element of the second type of memory cell.

16. The integrated circuit according to claim 1, wherein the integrated circuit is an application specific integrated circuit (ASIC).

17. A method of testing a non-volatile memory element integrated within a volatile memory, the method comprising:
    applying, pursuant to pre-laser testing of the non-volatile memory element, at least one logic voltage level to the non-volatile memory element to verify operation thereof;
    selectively accessing the non-volatile memory cell; and
    reading the at least one logic voltage level applied to the non-volatile memory element.

18. The method according to claim 17, further comprising:
    prior to the step of reading, precharging bit lines coupled to the non-volatile memory element.

19. The method according to claim 17, further comprising receiving a control signal operable to initiate the applying of the at least one logic voltage level to the non-volatile memory element.

20. A system comprising:
    a memory having a sense amplifier for writing to and reading from the memory, the memory comprising:
        a volatile memory; and
        a non-volatile memory, the volatile and non-volatile memories being coupled to the sense amplifier; and a control circuit coupled to the non-volatile memory and operable to selectively apply a logic voltage level to at least one memory element of the non-volatile memory for verifying operation thereof.

21. The system according to claim 20, wherein the non-volatile memory includes at least one fuse.

22. The system according to claim 20, wherein the volatile memory includes at least one of the following:

static random access memory, and dynamic random access memory.

23. The system according to claim 20, wherein the control circuit is operable to receive a test signal to initiate the selective application of the logic voltage level to the at least one memory element of the non-volatile memory for verifying operation thereof.

24. A method for accessing a datum value in a non-volatile memory cell in a random access memory device having volatile memory cells, non-volatile memory cells and at least one pair of bit lines coupled therebetween, the method comprising:

storing a datum value in the non-volatile memory cell;

selectively identifying the non-volatile memory cell from any of the volatile and non-volatile memory cells;

connecting the identified non-volatile memory cell to a bit line of the at least one bit line pair so as to create a charge differential across the at least one bit line pair, the polarity of the charge differential corresponding to a datum value stored in the identified memory cell;

sensing the charge differential between the bit lines of the at least one bit line pair and driving the bit lines towards reference voltage levels based upon the polarity of the charge differential; and providing the datum value stored in the identified memory cell externally to the memory device, the datum value corresponding to the voltage level of the bit line to which the identified non-volatile memory cell is connected.

25. The method according to claim 24, wherein the storing of the datum value includes blowing at least one fuse within the non-volatile memory cell.

26. The method according to claim 24, further comprising:

prior to the storing of the datum value in the non-volatile memory cell, applying a second datum value to the non-volatile memory cell to functionally verify operation thereof; and sensing the second datum value applied to the non-volatile memory cell in a volatile manner; and determining that the non-volatile memory cell is functionally operable based on the sensing of the second datum value.

27. The method according to claim 26, further comprising selectively issuing a command signal to initiate the applying of the second datum value.

28. The method according to claim 26, wherein the applying of the second datum value includes creating a charge differential on a bit line pair coupled to the non-volatile memory cell.

29. A method of testing a non-volatile memory element integrated within a volatile memory, the method comprising:

receiving a control signal pursuant to pre-laser testing of the non-volatile memory element;

applying at least one logic voltage level to the non-volatile memory element to verify operation thereof in response to the received control signal;

selectively accessing the non-volatile memory cell; and reading the at least one logic voltage level applied to the non-volatile memory element.

30. A system comprising:

a processor for processing data;

a memory having a sense amplifier for writing to and reading from the memory, the memory comprising:

a volatile memory and a non-volatile memory, the volatile and non-volatile memories being coupled to the sense amplifier; and a control circuit coupled to the non-volatile memory and operable to selectively apply a logic voltage level to at least one memory element of the non-volatile memory for verifying operation thereof.

31. The system according to claim 30, wherein the system includes at least one of the following in communication with the processor:

a display device;

a computing device; and a communication device.

* * * * *

UNITED STATES PATENT AND TRADEMARK OFFICE
CERTIFICATE OF CORRECTION

PATENT NO. : 6,781,916 B2 Page 1 of 1
APPLICATION NO. : 10/442844
DATED : August 24, 2004
INVENTOR(S) : David C. McClure It is certified that error appears in the above-identified patent and that said Letters Patent is hereby corrected as shown below:

Title Page, Delete ", and a division of application
(62) Related U.S. Application Data Section No. 09/751,986, filed on Dec. 29, 2000, now Pat. No. 6,584,007"

Column 1, lines 5-8 Delete "and application of pending U.S. patent application Ser. No. 09/751,986 filed Dec. 29, 2000, now U.S. Pat. No. 6,584,007"

Signed and Sealed this

Fifth day of September, 2006

JON W. DUDAS
*Director of the United States Patent and Trademark Office*